US005764655A

United States Patent [19]
Kirihata et al.

[11] Patent Number: 5,764,655
[45] Date of Patent: Jun. 9, 1998

[54] BUILT IN SELF TEST WITH MEMORY

[75] Inventors: Toshiaki Kirihata, Poughkeepsie; Christopher D. Wait, Beacon, both of N.Y.

[73] Assignee: International Business Machines Corporation, Armonk, N.Y.

[21] Appl. No.: 887,374

[22] Filed: Jul. 2, 1997

[51] Int. Cl.⁶ ........................................... G06F 11/00
[52] U.S. Cl. ........................................... 371/22.5
[58] Field of Search .................... 371/22.5, 22.6, 371/22.1, 25.1; 395/183.06, 183.18

[56] References Cited

U.S. PATENT DOCUMENTS

| 5,161,232 | 11/1992 | Beran . |
| 5,291,425 | 3/1994 | Nagaishi . |
| 5,301,199 | 4/1994 | Ikenaga et al. . |
| 5,303,199 | 4/1994 | Ishihara et al. . |
| 5,355,509 | 10/1994 | Beran . |
| 5,361,264 | 11/1994 | Lewis . |
| 5,369,648 | 11/1994 | Nelson . |
| 5,398,250 | 3/1995 | Nozuyama . |
| 5,448,110 | 9/1995 | Tuttle et al. . |
| 5,459,737 | 10/1995 | Andrews . |
| 5,485,467 | 1/1996 | Golnabi . |
| 5,504,903 | 4/1996 | Chen et al. . |
| 5,509,019 | 4/1996 | Yamamura . |
| 5,553,082 | 9/1996 | Connor et al. . |

OTHER PUBLICATIONS

Hiroki Koike, et al, A Bist Scheme Using Microprogram ROM for large Capacity Memories, IEEE 1990 International Test Conference, Paper No. 36.1, pp. 815–822.

Toshio Takeshima, et al, "A 55–NS 16–MB DRAM With Built–In Self–Test Function Using Microprogram ROM", IEEE Journal of Solid–State Circuits, vol. 25, No. 4, Aug. 1990, pp. 903–911.

*Primary Examiner*—Vincent P. Canney
*Attorney, Agent, or Firm*—Whitham, Curtis & Whitham; Dale M. Crockatt

[57] ABSTRACT

An integrated circuit chip and an electronic system are disclosed, each incorporating a self-test system. The integrated circuit chip includes capability for Built In Self Test (BIST) and a non-volatile memory where the BIST may be self-programmable. The electronic system comprises, an integrated circuit chip which includes on the chip Built In Self Test (BIST) and a non-volatile memory, together with an off-chip test target. The integrated circuit chip and the electronic system are particularly useful for simplifying the testing of electronic products both in manufacturing and in the field, and are even more particularly useful in eliminating the need for large, complex, high speed testers in the manufacturing environment, substituting instead a simple power chuck to plug the product into.

30 Claims, 2 Drawing Sheets

5,764,655

BUILT IN SELF TEST WITH MEMORY

RELATED APPLICATIONS

This invention is related to copending U.S. Pat. application Ser. No. 08/887,372, filed Jul. 2, 1997, entitled "Self Programmed Built In Self Test," and U.S. patent application Ser. No. 08/887,462, filed Jul. 2, 1997, entitled "Method of Self Programmed Built In Self Test," both of which are assigned to the present assignee and which are incorporated by reference in their entirety.

FIELD OF INVENTION

The present invention relates generally to error detection or correction, and fault detection or recovery in electronics, and in particular to built-in testing of integrated circuits.

BACKGROUND OF THE INVENTION

The testing of manufactured electronics has long been an area of focus in the electronics industry. The importance of testing in the manufacture of semiconductor integrated circuit (IC) chips has escalated because of ever increasing circuit speed and density. Memory technology, and in particular dynamic random access memory (DRAM) has continued to evolve to more bits per chip. This increase in the number of bits stored upon a single chip means that there is a corresponding increase in the number of memory cells and circuits which need to be tested per chip. Access times for DRAMs have also become shorter. This places demands on the tester for high speed operation. Similarly, logic ICs, ASICs, microprocessors, etc., offer greater amounts of functionality on a single chip. Greater functionality directly equates to more testing to perform, and hence more tester time per chip. Similarly, the greater functionality creates a demand for high speed testers. To keep up, the testers must be able to operate at higher frequency signal rates so as to confirm the faster circuit operation of the chips. The market place will pay a premium for chips which perform faster and over a greater extreme of operating conditions, thus testers must perform a sorting of the chips as well. Lastly, in any manufacturing environment it essential that there be no bottle-necks in product flow from sector to sector in a production line. This includes the time a product spends in test. This means that there must be some combination of either more testers to test chips, or that the tester is able to complete its battery of tests upon a chip in less time. The increase in circuit density and speed of integrated circuits places a need on chip testers to test at greater levels of complexity, at higher frequency signal rates, perform sorts upon the chips, and with less test time per chip. A significant number of expensive testers will thus be required if any significant volume of product is to be expected.

When sorting chips for performance there is always a chance that mishandling of the sorted chips may occur, i.e. chips identified as high-speed inadvertently get swapped for chips that are slow-speed. An approach taken to minimize this type of problem is to apply a sort ID to each chip. This may be done by laser scribing on the back of the chip. A more desirable technique requires the tester to apply the sort ID at sort time. For example, by providing the chip with an on-chip fuse bank, the tester can burn-in with a sort code. The advantage is that mishandling is eliminated, and a subsequent system in which the chip is installed may have access to this sort code and thereby report the chip performance type to the system. Indeed it is desirable that other test results be reportable as well. The disadvantage is that tester complexity and test time are increased.

FIGS. 1 and 2 show previously known solutions to the aforesaid needs.

One prior art approach to chip testing implements the BIST technique. The external off-chip tester invokes the self test mode within the chip by supplying a proscribed signal to the chip. One example of which is the application of the combination of RAS (Row Address Signal), CAS (Column Address Signal), WE (Write Enable) and ADD (Address) a starting address. Upon invocation of the self test mode the BIST will begin testing the measured components as proscribed by the program instructions residing in the BIST's internal ROM as is well known in the art. Please note that the internal functioning of a BIST is well known in the art and will receive only cursory explanation here. A typical example of the type of measured component which the BIST is used to test is a memory cell location or an array of memory cell locations. Common tests performed when the measured components are an array of memory cells would include a Marching test, a Checkerboard test or a Unique Address test, in each case the data retention in the cells is being checked. There are many other tests that are possible, however after each test is performed a pass/fail result is passed from the BIST to the tester. BIST testing may actually require a longer test time per chip, but has the advantage of requiring a much simpler and therefore less costly tester. Any Manufacturing bottle necks are reduced by having more testers, which is economically more feasible because of the reduced cost per tester.

FIG. 2 shows a prior art improvement to the arrangement of FIG. 1. A multiplexer has been added so as to effectively allow near simultaneous testing of a multiple of chips, all of which contain BIST circuitry. This allows a greater throughput of product through test, for only the minimal complexity increase of the added multiplexer. This again reduces the cost of testing.

However, there are further problems which confront the traditional chip and tester scenario. They are probe and cable hookup technology, and I/O (Input & Output) constraints. At the very high clock rates and high speed signal waveforms being employed with today's chip technology, the I/O, probe and hookup cabling to the tester interface behave as differing transmission lines. The chips must use driver circuits to send signals off-chip and which of necessity must actually slow the circuit swings down so as to prevent problems with simultaneous switching and overshoot/undershoot transmission line effects. Even when driver and probe technology are not a limitation, the number of chip I/O corrections imposes a limit to the amount of satisfactory chip testing which may be accomplished. Because most chips are I/O limited by product needs, there is very limited availability of any remaining I/O which could be allocated to the test of important internal circuit nodes. The technique of providing Built In Self Test (BIST) circuitry has evolved to address some of these limitations. BIST, because it is on-chip, circumvents many of the above problems and allows the tester to effectively test internal nodes and performance parameters that otherwise could not be accommodated. However, BIST still requires a tester to program, direct, and collect results from the BIST. Even with a self-programmable BIST, as provided in the co-pending patent initiation, data collection requires more tester than is ideal in a manufacturing environment.

Subsequent to manufacturing there are in-the-field needs that the chips should fulfill. First as mentioned above, a chip ID or sort code, plus other performance parameters which may be reported to the system or subsystem electronically is desirable. Secondly, when there is an in-field system fail, it is desirable to provide final test results to the field technician or engineer for a given specific chip. In particular, there is a need to provide in-field retesting of a chip and provide a report of any change in the chip performance which deviates from that obtained when the chip was manufactured. Ideally, this data should be provided conveniently and with the minimum of trouble-shooting equipment.

Therefore, there exists a demand for chip testing in a manufacturing environment which is both timely, and yet provides an improved quality and quantity of test results. There also exists a demand for producing sorted and electronically labelled chips without further impacting the chip testing through-put. Lastly, there is a demand for chips which may be readily trouble-shooted in the field. Thus, it would be desirable to provide a means for satisfying such demands and solving the aforesaid and other deficiencies and disadvantages.

SUMMARY OF THE INVENTION

It is therefore an object of the present invention to eliminate the need for testers in the manufacturing environment.

Another object of the present invention is to provide an integrated circuit chip with both, self-programmable built in self test capabilities, and with non-volatile memory, so that the chip may test itself and store the results on-chip, allowing the test results to be read at a later time.

Another object of the present invention is to provide an integrated circuit chip with the ability to report the actual process variation realized in that chip's manufacture.

Another object of the present invention is to provide an integrated circuit chip with self sorting capability by providing the chip with both self-programmable built in self test capabilities to test for a sort parameter and non-volatile memory to store a sort code representative of that sort test result.

Another object of the present invention is to provide for the testing of an integrated circuit chip by simply placing the chip in a chuck. A chuck which need only supply electrical power to the chip.

Another object of the present invention is to provide in the field access of chip self test results.

Yet another object of the present invention is to provide in the field access of chip self test results via an on chip RF transmitter.

Still yet another object of the present invention is to furnish in the field retesting of an integrated circuit chip by providing both an on chip RF receiver for communicating a retest command and an on chip RF transmitter to communicate the test results.

In accordance to the present invention, an integrated circuit chip is disclosed which comprises a means for performing BIST, and a memory where the BIST means performs a test and stores a result from the test in the memory.

In the alternative, an integrated circuit chip is disclosed which comprises a means for performing BIST, and a RF transmitter where the means for performing BIST performs a test, and causes the RF transmitter to transmit a result.

Furthermore, an electronic system is disclosed which comprises an integrated circuit chip having both a means for performing BIST and a non-volatile memory together with a test target separate from the integrated circuit chip; and where the means for performing BIST performs a test upon the test target and stores the result in the non-volatile memory.

BRIEF DESCRIPTION OF THE DRAWINGS

The objects, features and advantages of the present invention will be apparent from the following more particular description of the invention illustrated in the accompanying drawings, in which.

DETAILED DESCRIPTION OF THE INVENTION

Figure 1:
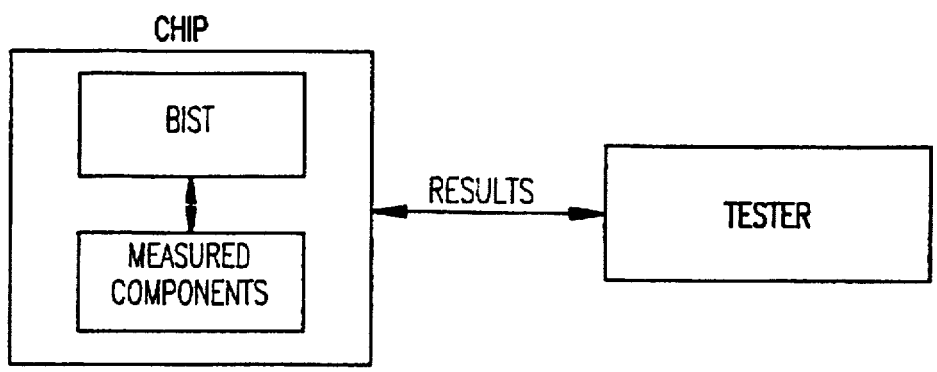
FIG. 1 illustrates a prior art tester and chip with Built In Self Test.
Figure 2:
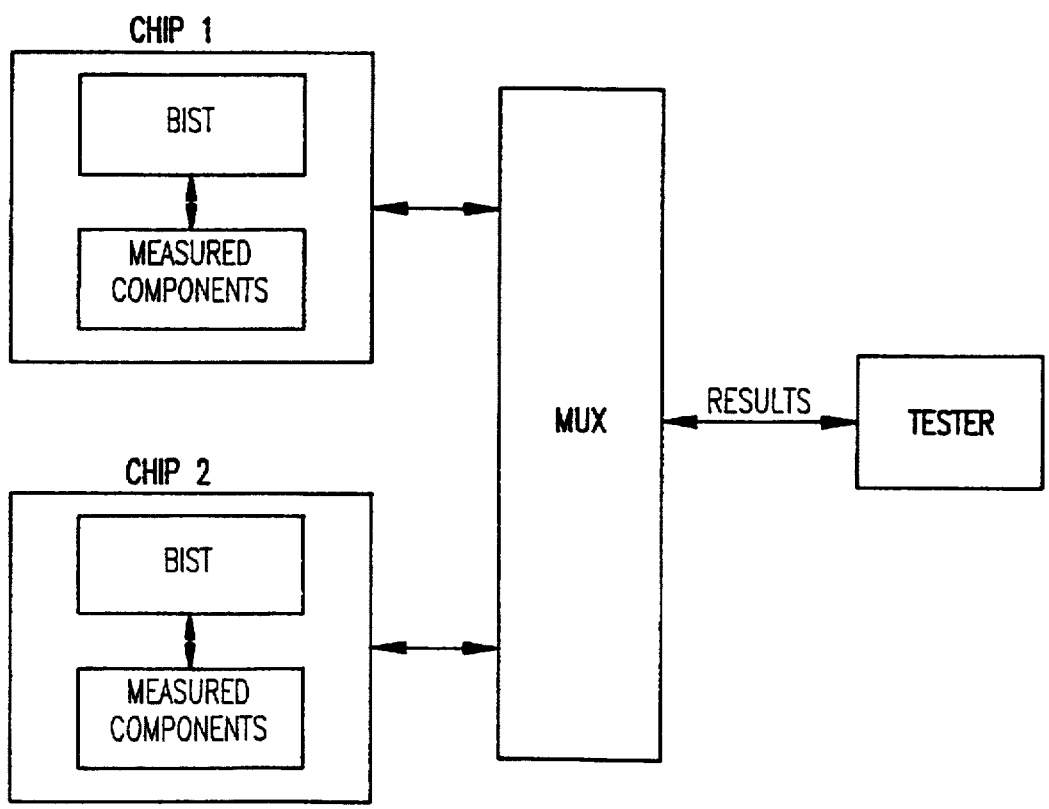
FIG. 2 illustrates a further prior art approach, in which a multiplexer is used to improve the through-put of a tester.
Figure 3:
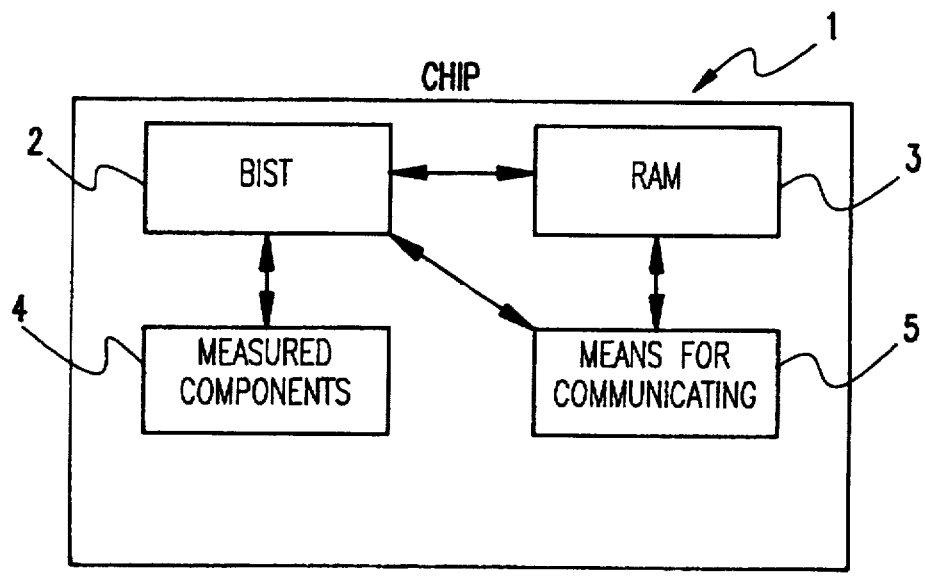
FIG. 3 illustrates a block diagram of the general elements of the present invention.

Referring to FIG. 3, according to the present invention, there is shown a Chip (1) comprising: a BIST (2), a Random Access Memory or RAM (3), preferably Non-Volatile (NVRAM), Measured components (4), and Means for Communicating (5).

The Built In Self Test or BIST (2) typically comprises a dedicated Read Only Memory (ROM) which contains micro-code instructions, addressing circuitry, comparator logic and so on as is commonly understood in the art as needed to enhance chip testing using BIST techniques. The functional capabilities needed for BIST vary with the parameter and circuit testing desired for a given chip design. However, the essential functions of a BIST comprise: an addressing means to select a particular component for measurement; a means for imposing a test condition upon the selected component; means for measuring a resultant parameter; and I/O means for passing that parameter on, or in the alternative when a comparator means is provided to compare the resultant parameter with an expected result, to pass on the result of that compare. Micro-code for determining the addressing patterns, imposed test conditions, and any expected result are stored in a dedicated ROM within the BIST.

A Random Access Memory (RAM) (3) addressable and at least writable by the BIST is provided. The RAM (3) may be a simple small register or in the alternative constitute a large address space of memory elements. The RAM maybe of a type including, but not limited to, PROMs, EPROMs, EEPROMs, SRAMs, and DRAMs. In the preferred embodiment the RAM (3) is non-volatile, NVRAM. As such the NVRAM may contain cells which are fuses built of polysilicon or metal straps or most preferably an electrically breakable dielectric film similar to that described in U.S. Pat. No. 5,303,199 the disclosure of which is incorporated by reference herein. Voltage Pump circuits may be provided as an aid to the BIST in the blowing of a given fuse element during a write operation by the BIST.

The Measured Components (4) is understood to include all manner of elements found on the Chip (1) and to also include the measurement of elements found off-chip as well. Examples of on chip measured components would include the typical measurement of memory array cells for data retention; measurement of internal circuit or device node voltages; measurement of process parametrics such as oxide thickness or transistor gain; measurement of logic block functionality by providing digital stimulus to the block inputs and comparing the output from the logic block with an expected result; circuit access time measurements and so on. Examples of off-chip measurements would be similar to the above but as found on a system or board/card level.

The Means for Communicating (5) most typically includes chip I/O and power pins. I/O and power pins include, but are not limited to, on-chip conductive pads, Lead-Tin Ball Grid Arrays, Flying wire bonds, or chip package/carrier pins. In the above examples, communication may be by application of D.C. or A.C. signals either singly or with an unique combination of pins. A conventional BIST approach applies the RAS, CAS, and WE signals in combination with starting address ADD to signal the start of BIST testing. In a preferred embodiment, a dedicated pin is provided, which upon application of a power supply voltage will thereby signal the start of BIST testing. The means for communicating (5) also includes using Radio Frequency (RF) or Infra-red receivers or transmitters provided on chip, as used alone or in combination with the pins noted above. This is to allow communication absent actual physical contact with the chip (1).

In operation, power is applied to the Chip (1). A signal is provided via Means for Communicating (5) to the BIST (2) to invoke self test mode. Whereupon, the BIST (2) will address a particular Measured Component (4) applying a test condition. The BIST (2) will then measure a resulting parameter from the Measured Component (4) and store the result in the RAM (3). The stored results may be read then or at a later time by a simple electrical reader. Also, the stored results may be accessed by the system into which the Chip (1) is later installed.

Figure 4:
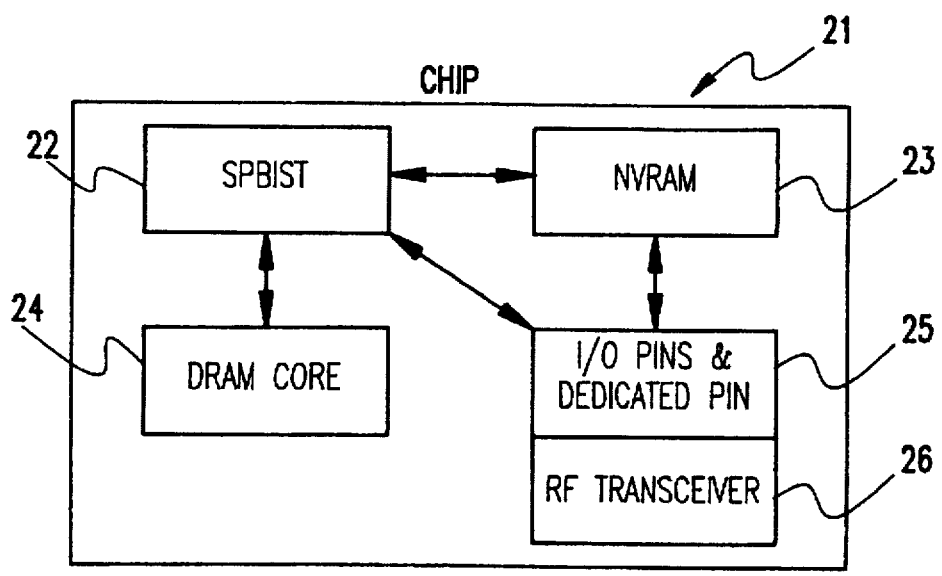
FIG. 4 illustrates a block diagram of 9 preferred embodiments for the present invention.

Turning now to a preferred embodiment as shown in FIG. 4, there is shown a Chip (21) comprising: a SPBIST (22), a Non-Volatile Random Access Memory or NVRAM (23), a DRAM Core (24), and a means for communicating, comprising I/O Pins, one of which is a Dedicated Pin (25), and a RF Transceiver (26).

In a preferred embodiment, the Chip (21) is provided with two Means for Communicating, the first of which is a Dedicated Pin (25). The Dedicated Pin (25) is connected to the BIST such that with the application of power the self test mode is invoked. The Chip (21) is placed in a chuck which supplies power to all the power pins plus the dedicated pin. The chuck may be arranged to power one or many chips simultaneously. Alternatively, the chuck may be arranged to accept and power an entire wafer of un-diced chips simultaneously. Thus, simply with the application of power, the chip (21) is both powered up and the self test mode of BIST operation is invoked.

The second Means for Communicating is a RF Transceiver (26). IC RF Transceivers art known in the art and an exemplary example of such is disclosed in U.S. Pat. No. 5,448,110 the disclosure of which is incorporated by reference herein. As an alternative to use of the Dedicated Pin (25) to invoke self test mode, the RF Transceiver may be used instead. Thus, when a suitable RF source is brought in proximity with the Chip (21) the RF Transceiver (26) is caused to send a signal to the SPBIST (22) such that it commences self testing. In a preferred embodiment, the RF Transceiver (26) is able to transmit data as well, in particular data found in the NVRAM (23) or directly from the SPBIST (22).

In an alternative preferred embodiment, the BIST is a Self-Programmable Built In Self Test or SPBIST (22). As such it is provided with a Self-Program Circuit and Command Register for determining functionality limits as described in the related application, the disclosure of which is incorporated by reference herein. These functionality limits may include many parameters, but for the preferred embodiment particularly include the voltage performance space and corresponding access times.

In another preferred embodiment, DRAM Core (24) of the conventional type is provided and typically comprises, Column Decoders, Row Decoders, Sense Amplifiers, Column Switches, and an Array of Memory Cells. The DRAM Core is one example of a measured component; others include but are not limited to: an array of logic cells, individual logic blocks, individual active or passive devices, process parameters like oxide or insulator thickness, and so on. A DRAM Core is a convenient choice since it is well understood and has its own addressing circuitry.

The NVRAM in another preferred embodiment is comprised of fusible links of the electrically breakable dielectric film type. The fusible links are provided as a dedicated array of memory cells where the storage capacitor in the cell is capable of being shorted when blown by sufficient write voltage. This may be achieved by use of a special mask step in processing which provides a much thinner oxide in the NVRAM (23) than in the DRAM Core (24). Voltage pump circuits that provide a higher than normal voltage when the cell is written may also be used.

In the operation of a preferred embodiment, the Chip (21) is placed into a chuck or probe arrangement such that power is provided to the power pins of the Chip (21) and also Dedicated Pin (25) at the same time. As a consequence a signal is provided the SPBIST (22) to place itself and the Chip (21) into self test operation. The SPBIST (22) performs its battery of tests including the data retention of the array cells in DRAM Core (24). But because it is self-programmable the SPBIST (22) it can incrementally vary the applied circuit voltage to the DRAM Core (24) to determine the operational voltage space for the DRAM Core (24). Thus, upon successful completion of a first test of the DRAM Core (24) at nominal, the SPBIST (22) stores in the NVRAM (23) indication of the successful operation of the DRAM Core at nominal supply voltage. Then as the SPBIST (22) finds the upper and lower voltage limits of the DRAM Core (24) indicators of these values are next stored in the NVRAM (23). The SPBIST (22) will then measure the access time in the DRAM Core (24) at those voltage supplies (nominal, upper & lower). An indicator for the measured access times is stored by the SPBIST (22) into the NVRAM (23). The Chip (21) may now be removed from the power chuck and stored for sorting at a later time. The sorting is performed by a simple reader which accesses the data in the NVRAM (23). Various addressing schemes may be used to differentiate the NVRAM (23) addresses from the DRAM Core (24) addresses. In a preferred embodiment, the NVRAM (23) address space simply picks up numerically where the DRAM CORE (24) address space leaves off. This allows the use of the same addressing circuitry for both of the memory arrays. An alternative would be to provide the power chuck with the reader circuitry so that sorting could be performed immediately following self test. This approach would be particularly attractive in a manufacturing environment where mechanical handlers are available to physically sort the chips into carriers.

A RF Transceiver (26) is also provided in the preferred embodiment. It may be used when the chip (21) is mounted in a system and has been deployed into the field. A loop antenna is provided either on chip or on the card or substrate upon which the Chip (21) is mounted. In this way, when a RF Wand or interrogator is brought into close proximity with the Chip (21), it can provide a suitable signal to the RF Transceiver (26) to direct it to access the contents of the NVRAM (23) and transmit that data to the RF Wand. Similarly the RF Wand can provide a signal directing the SPBIST (22) via the RF Transceiver to retest the Chip (21).

The results are channelled to the RF Transceiver (26) and transmitted to the RF Wand. A comparator may be provided either in the RF Wand or on Chip (21) so that only those current test results which are different from the contents of the NVRAM are displayed on the RF Wand. In this way, any changes in the performance of Chip (21) may be analyzed in the field. Similar functional capability may be provided by the system in which the Chip (21) is assembled.

While the invention has been described in terms of several preferred embodiments, various alternatives and modifications can be devised by those skilled in the art without departing from the invention. Accordingly, the present invention is intended to embrace all such alternatives which fall within the scope of the appended claims.

What is claimed is:

1. An integrated circuit chip comprising:

a means for performing BIST; and a memory;

wherein the BIST means performs a test and stores a result from the test in the memory.

2. The integrated circuit chip of claim 1, wherein the memory is a non-volatile memory.

3. The integrated circuit chip of claim 2, wherein the BIST is a self-programmable BIST.

4. The integrated circuit chip of claim 2, wherein the non-volatile memory is NVRAM.

5. The integrated circuit chip of claim 2, wherein the non-volatile memory is a fuse.

6. The integrated circuit chip of claim 2, additionally comprising an on chip test target, wherein the means for performing BIST performs a test on the target and stores a result from the test in non-volatile memory.

7. The integrated circuit chip of claim 6, wherein the target is a circuit.

8. The integrated circuit chip of claim 6, wherein the target is a device.

9. The integrated circuit chip of claim 6, wherein the target is a component.

10. The integrated circuit chip of claim 6, wherein the target is a structural element.

11. The integrated circuit chip of claim 6, wherein the target is a circuit path.

12. The integrated circuit chip of claim 6, wherein the means for performing BIST further comprises:

a) a means for imposing a test condition upon the target;

b) a means for measuring a parameter from the test target; and c) a means for storing a value for the parameter in the non-volatile memory.

13. The integrated circuit chip of claim 2, additionally comprising a means for communicating a signal to the BIST, wherein the means for performing BIST is responsive to the signal, and wherein the BIST means performs a test and stores a result from the test in the non-volatile memory in response to communication of the signal to the BIST.

14. The integrated circuit chip of claim 13, wherein the means for communicating a signal is a power pin, and the signal is a power source.

15. The integrated circuit chip of claim 13, wherein the means for communicating a signal is a signal pin, and the signal is a signal source.

16. The integrated circuit chip of claim 13, wherein the means for communicating a signal is a RF receiver, and the signal is a RF source.

17. The integrated circuit chip of claim 2, additionally comprising a RF transmitter, wherein the means for performing BIST causes the RF transmitter to transmit the contents of the non-volatile memory.

18. The integrated circuit chip of claim 17, wherein subsequent to the BIST means storing the result from the test in the non-volatile memory, the BIST means causes the RF transmitter to transmit the result.

19. The integrated circuit chip of claim 17, additionally comprising a means for communicating a signal to the BIST, wherein the means for performing BIST is responsive to the signal, and wherein the RF transmitter transmits the contents of the non-volatile memory in response to the communication of the signal to the BIST.

20. The integrated circuit chip of claim 19, wherein the means for communicating a signal is a RF receiver, and the signal is a RF signal.

21. An integrated circuit chip comprising:

a means for performing BIST; and a RF transmitter;

wherein the means for performing BIST performs a test, and causes the RF transmitter to transmit a result.

22. An electronic system comprising:

an integrated circuit chip having a means for performing BIST and a non-volatile memory; and a test target separate from the integrated circuit chip;

wherein the means for performing BIST performs a test upon the test target and stores the result in the non-volatile memory.

23. The electronic system of claim 22, wherein the test target is a second integrated circuit chip.

24. The electronic system of claim 22, wherein the test target is a circuit card.

25. The electronic system of claim 22, wherein the test target is a circuit upon a circuit card.

26. The electronic system of claim 22, wherein the test target is a device.

27. The electronic system of claim 22, wherein the test target is a component.

28. The electronic system of claim 22, further comprising a control means.

29. The electronic system of claim 22, further comprising a communication means.

30. The electronic system of claim 22, further comprising a handler means.

* * * * *